United States Patent
Sanchez Castillo et al.

(10) Patent No.: US 11,953,770 B2
(45) Date of Patent: Apr. 9, 2024

(54) DISPLAY DEVICE HAVING INTEGRATED, OPTICALLY OPERATING PROXIMITY SENSOR SYSTEM

(71) Applicant: BEHR-HELLA THERMOCONTROL GMBH, Lippstadt (DE)

(72) Inventors: Alberto Sanchez Castillo, Lippstadt (DE); Tobias Schwab, Lippstadt (DE); Willem Hofman, Lippstadt (DE); Jeah-Sheng Wu, Lippstadt (DE); Rüdiger Schmidt, Lippstadt (DE)

(73) Assignee: BEHR-HELLA THERMOCONTROL GMBH, Lippstadt (DE)

( * ) Notice: Subject to any disclaimer, the term of this patent is extended or adjusted under 35 U.S.C. 154(b) by 39 days.

(21) Appl. No.: 17/760,687

(22) PCT Filed: Sep. 21, 2020

(86) PCT No.: PCT/EP2020/076308
§ 371 (c)(1),
(2) Date: Mar. 15, 2022

(87) PCT Pub. No.: WO2021/058436
PCT Pub. Date: Apr. 1, 2021

(65) Prior Publication Data
US 2022/0390784 A1 Dec. 8, 2022

(30) Foreign Application Priority Data

Sep. 24, 2019 (DE) ..................... 10 2019 125 671.2

(51) Int. Cl.
*G06F 3/041* (2006.01)
*G02F 1/1333* (2006.01)
(Continued)

(52) U.S. Cl.
CPC .... *G02F 1/13338* (2013.01); *G02F 1/133509* (2013.01); *G02F 1/1362* (2013.01);
(Continued)

(58) Field of Classification Search
CPC .......... G02F 1/13338; G02F 1/133509; G02F 1/1362; G02F 1/1333; G06F 3/017;
(Continued)

(56) References Cited

U.S. PATENT DOCUMENTS 7,420,547 B2 9/2008 Takahashi
8,860,694 B2 10/2014 Hwang et al.
(Continued)

FOREIGN PATENT DOCUMENTS

CN 201383058 Y 1/2010
DE 10 2016 100 363 A1 7/2016
(Continued)

OTHER PUBLICATIONS

International Search Report (PCT/ISA/210) issued in PCT Application No. PCT/EP2020/076308 dated Dec. 15, 2020 with English Translation.
(Continued)

*Primary Examiner* — Adam R. Giesy
(74) *Attorney, Agent, or Firm* — BakerHostetler

(57) ABSTRACT

The invention relates to a display device having an integrated, optically operating proximity sensor system (76) for detecting an object present within an observation space in front of the display device, such as a hand or a finger of a hand of a person. The display device is provided with a display unit (11) which has a front side (60) having an information-displaying display surface (62) and having an edge region (64), which adjoins said display surface and is not used for the display of information, and a rear side. The display device also has a proximity sensor system (76)
(Continued)

Figure 1:
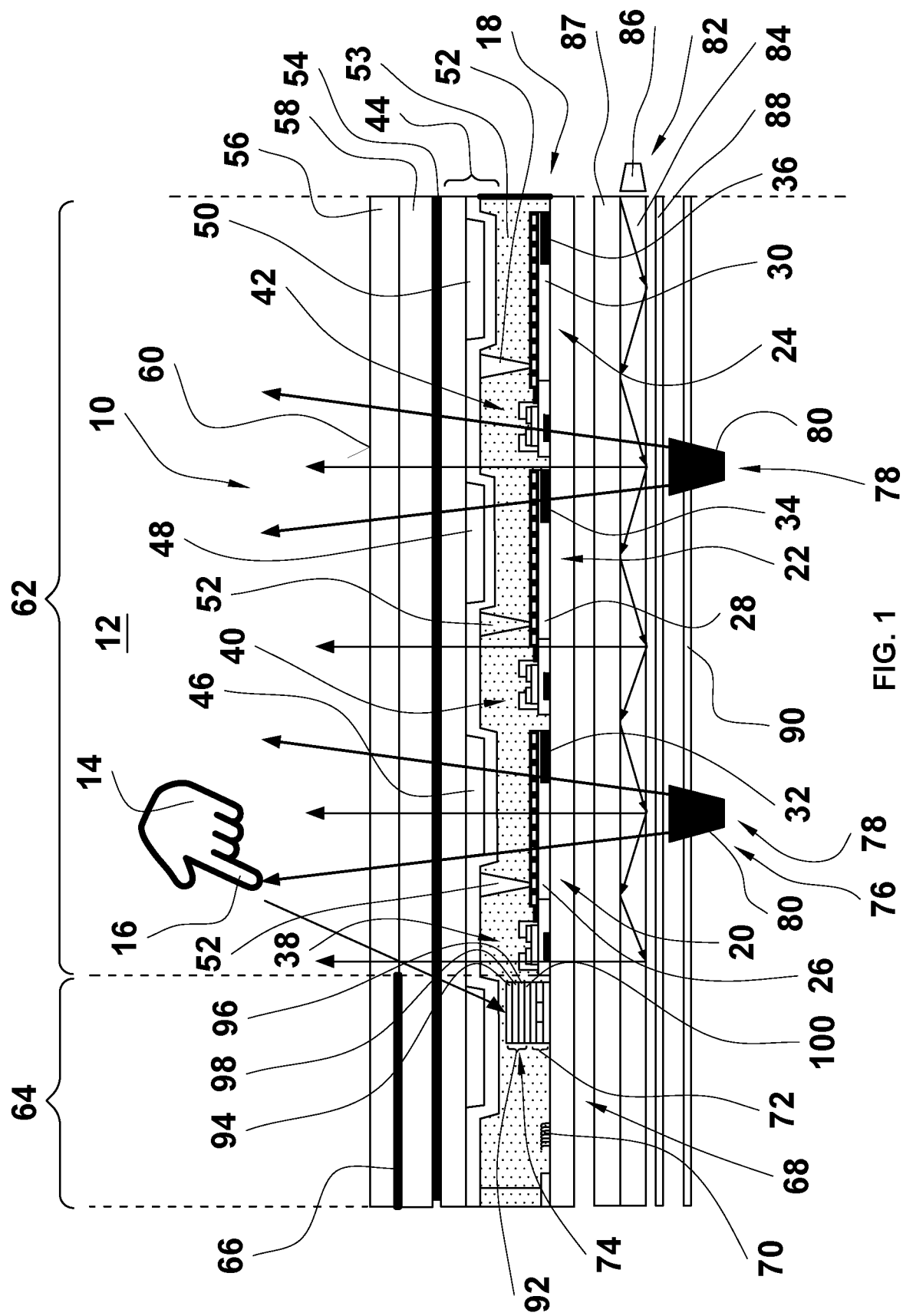

having at least one transmitter (78) for emitting sensor radiation towards the observation space and having at least one receiver (74) for receiving sensor radiation reflected from the observation space. Said proximity sensor system (76) is arranged at least partially in the edge region (64) of the front side (60) of the display unit (11) in which at least one receiver of the proximity sensor system (76) is arranged in thin-film technology. The at least one transmitter (78) of the proximity sensor system (76) can be integrated either below the display unit (11) or therein.

15 Claims, 4 Drawing Sheets

(51) Int. Cl.
  *G02F 1/1335* (2006.01)
  *G02F 1/1362* (2006.01)
  *G06F 3/01* (2006.01)
(52) U.S. Cl.
  CPC ............ *G06F 3/017* (2013.01); *G06F 3/0412* (2013.01); *G06F 2203/04101* (2013.01)
(58) Field of Classification Search
  CPC ......... G06F 3/0412; G06F 2203/04108; G06F 2203/04101; G06F 3/042; G06F 3/0421; H10K 59/12; H10K 59/60
  See application file for complete search history.

(56) References Cited

U.S. PATENT DOCUMENTS

| 9,557,846 | B2 | 1/2017 | Baharav et al. |
| 2009/0231497 | A1 | 9/2009 | Takahashi et al. |
| 2010/0220269 | A1 | 9/2010 | Takama et al. |
| 2011/0115749 | A1 | 5/2011 | Yi et al. |
| 2011/0193818 | A1 | 8/2011 | Chen et al. |
| 2011/0221705 | A1 | 9/2011 | Yi et al. |
| 2014/0191110 | A1* | 7/2014 | Holenarsipur ........ G06F 3/0421 250/206 |
| 2014/0192023 | A1 | 7/2014 | Hoffman |
| 2015/0084928 | A1 | 3/2015 | Wyrwas et al. |
| 2017/0090608 | A1* | 3/2017 | Vieta ................. H04M 1/72454 |
| 2018/0069609 | A1 | 3/2018 | Wang et al. |

FOREIGN PATENT DOCUMENTS

| EP | 3 334 130 A1 | 6/2018 |
| GB | 2486000 A | 6/2012 |
| WO | 2014/156399 A1 | 2/2014 |
| WO | 2019/012046 A1 | 1/2019 |
| WO | 2019/197525 A1 | 10/2019 |

OTHER PUBLICATIONS

Written Opinion (PCT/ISA/237) issued in PCT Application No. PCT/EP2020/076308 dated Dec. 15, 2020.

Burgi et al., "Optical proximity and touch sensors based on monolithically integrated polymer photodiodes and polymer LEDs", Science Direct 7: pp. 114-120 (2006).

Kratz et al., "Hoverflow: Exploring Around-Device Interaction with IR Distance Sensors", MobileHCI'09: ACM 978-1-60558-281-83 (Sep. 15-18, 2009).

Kratz, "Sensor-Based User Interface Concepts for Continuous, Around-Device and Gestural Interaction on Mobile Devices" München, den (Jun. 6, 2012).

Oh, et al. "Gesture Sensor for Mobile Devices" Samsung Electronics Co., Ltd. pp. 1-12 (2013).

Zhou et al. "Highly Sensitive a-Si:H PIN Photodiode Gated LTPS TFT for Optical In-Display Fingerprint Identification" Digest (2018).

* cited by examiner

DISPLAY DEVICE HAVING INTEGRATED, OPTICALLY OPERATING PROXIMITY SENSOR SYSTEM

CROSS-REFERENCE OF RELATED APPLICATIONS

This application is the U.S. National Phase under 35 U.S.C. § 371 of International Patent Application No. PCT/EP2020/076308, filed on Sep. 21, 2020, which claims the benefit of German Patent Application No. 10 2019 125 671.2, filed on Sep. 24, 2019, the entire disclosures of each are incorporated by reference herein.

The present application claims the priority of the earlier German Patent Application 10 2019 125 71.2 of Sep. 24, 2019, the content of which is integrated herein by reference.

The invention relates to a display device with an integrated, optically operating proximity sensor system for detecting an object present within an observation space in front of the display device, such as a hand or a finger of a person's hand, in particular for gesture recognition and/or far-field sensing.

INTRODUCTION

Automotive Human Machine Interface (HMI) products nowadays implement ever more complex user interactions in order to provide a high level of convenience to the user. The main communication and interaction channel between a human being and a vehicle is the display unit. In recent decades, displays in cars have developed new technological features that enhance and maximize the user experience. Thanks to the most recent technological developments, it is now possible to create complex Center Information Displays (CID) that integrate acoustic feedback, haptic feedback, touch detection, light detection, and gesture recognition. Actually, the solutions for integrating gesture recognition are limited in the automobile market.

Examples for HMI products are described in WO-A-2019/012046, WO-A-2014/156399, US-A-2009/0231497, US-A-2010/0220269, US-A-2011/0221705, US-A-2011/0115749, US-A-2011/0193818, US-A-2014/0192023, US-A-2015/0084928, US-A-2015/0084928, US-A-2018/0069609, U.S. Pat. Nos. 8,860,694 B and 9,557,846 B, PCT/EP2019/059234, DE-A-10 2016 100 363, GB-A-2 486 000, CN-Y-201383058Y, KRATZ, Sven; ROHS, Michael: Hoverflow: Exploring Around-Device Interaction with IR Distance Sensors, 11th International Conference on Human-Computer Interaction with Mobile Devices and Services, MobileHCI '09, Bonn, Germany, Sep. 15-18, 2009, Conference Proceedings, ISBN 978-1-60558-281-8. New York: ACM, 2009. Article No. 42, KRATZ, Sven: Sensor-Based User Interface Concepts for Continuous, Around-Device and Gestural Interaction on Mobile Devices. Dissertation, Fakultät für Mathematik, Informatik und Statistik, Ludwig-Maximilians-Universität München. München: LMU, 2012, OH, KyongSae; HWANG, Seok-Hee; YOU, SeungBin et al.: Gesture Sensor for Mobile Devices—White Paper, Firmenanschrift, Samsung Electronics Co. Ltd. Suwon-si, Gyeonggi-do, KR: Samsung, 2013.

Further, BÜRGI, L. [u. a.]: Optical proximity and touch sensors based on monolithically integrated polymer photodiodes and polymer LEDs. In: Organic Electronics, Vol. 7, Nr. 2, 2006, S. 114-120. DOI: https://doi.org/10.1016/j.orgel.2005.12.002. Science Direct [online] und ZHOU, X. [u. a.]: Highly Sensitive a-Si:H PIN Photodiode Gated LTPS TFT for Optical In-Display Fingerprint Identification. In: Society for Information Display International Symposium Digest of Technical Papers, Vol. 49, Nr. 1, 2018, S. 490-493. DOI: https://doi.org/10.1002/sdtp.12608. Wiley Online Library [online] describes photodiodes in various technologies.

Gesture recognition and far-field sensing in cars use approaches that are based mainly on infrared (IR) sensing or cameras. With many internal architectures in cars, the IR sensing systems for gesture recognition and far-field sensing are integrated and designed separately from the display. Other IR systems are integrated on the display so as to allow only touch detection. The main disadvantage of these IR detection designs is that, for integration, they require space in a car in addition to the display in the vehicle. The future trend in car interiors is toward ultra-flat display systems, whose display surfaces extend almost to the display edge, i.e. have only extremely narrow edge regions not useful for displaying information. The integration of the present IR-based systems for CIDs and other display elements in a car make a realization of ultra-slim border display designs thus impossible. Therefore, new approaches for the integration of IR detection systems into display units have to be developed.

OBJECT OF THE INVENTION

It is an object of the invention to further enhance, and in particular to simplify, the manufacture of a display device with an integrated, optically operating proximity sensor system, wherein in particular the edge region of the display device which cannot be used to display information is still to be used for accommodating at least parts of the proximity sensor system, although this edge region is rather narrow by design.

INVENTION

To achieve this object, the invention proposes a display device comprising an integrated, optically operating proximity sensor system for detecting an object, such as e.g. a hand or a finger of a person's hand, present within an observation space in front of the display device, in particular for gesture recognition and/or far-field sensing, the display device being provided with a display unit having a front side with a display surface displaying information, an edge region adjacent to the display surface and not used for the display of information, and a rear side, and a proximity sensor system comprising at least one transmitter for emitting sensor radiation into the observation space, and comprising at least one receiver for receiving sensor radiation reflected from the observation space, wherein the proximity sensor system or at least its at least one receiver and its at least one transmitter is/are arranged in the edge region of the front side of the display unit, or the at least one transmitter of the proximity sensor system is arranged below the display unit, e.g. below the region occupied by the display surface, or below the edge region of the display unit or on the rear side of the display unit or facing the rear side of the display unit or in the display unit, and the at least one receiver of the proximity sensor system is arranged in the edge region adjacent to the display surface on the front or the rear side of the display unit, or the at least one receiver of the proximity sensor system is arranged below the display unit, e.g. below the region occupied by the display surface, or below the edge region of the display unit or on the rear side of the display unit or facing the rear side of the display unit or in the display unit, and the at least one transmitter of the proximity sensor system is arranged in the edge region adjacent to the display surface on the front or the rear side of the display unit, wherein the display unit comprising a TFT display panel having an upper side forming the front side of the display unit which comprises an area aligned with the display surface and having TFT transistors, and a protrusion region surrounding this area and forming the edge region, and having a lower side facing away from the upper side, and comprising a color filter layer arranged above or on the upper side of the display panel, wherein the TFT display panel optionally projecting beyond the color filter layer at at least one edge region, and this protrusion forming the edge region laterally adjacent to the display surface or, optionally, the TFT display panel comprising, among others, pixels and transistors produced in thin-film technology, which together represent the display surface of the display unit, and the TFT display panel protruding beyond the display surface at at least one edge region, and this protrusion forming the edge region laterally adjacent to the display surface, wherein the at least one transmitter and the at least one receiver of the proximity sensor system are arranged within the protrusion region of the TFT display panel on the upper or the lower side thereof, or the at least one receiver or the at least one transmitter of the proximity sensor system is arranged within the protrusion region of the display panel on the upper or the lower side thereof, and wherein the at least receiver and/or the at least one transmitter of the proximity sensor system each being configured as a semiconductor diode comprising semiconductor layers formed in TFT technology on the display panel and arranged side-by-side or above each other and adjacent to each other.

It is an essential feature of the invention to form at least parts of the proximity sensor system, i.e., for example, the receiver(s) of the proximity sensor system, with the same planar technology in which also the standard thin-film transistors (TFTs) of TFT array technology display devices are produced. A TFT transistor consists of a plurality of stacked semiconductor or metallization layers, which are successively manufactured planarly in individual steps.

Accordingly, the proximity sensor system provided by the invention comprises semiconductor diodes at least as the receivers, wherein so-called PIN photodiodes are used advantageously. Similar to the TFT transistors, these diodes can be built planarly in a plurality of production steps. The TFT array may, for example, be produced in a standard manner to afterwards undergo another process in which, like before, a plurality of semiconductor materials layers are arranged side-by-side or stacked, so as to form the diodes of the proximity sensor system, in particular the photodiodes of the receivers. For this purpose, the unused edge region around the actual display surface of the display unit is suitable for placement. Here, the semiconductor layers of the respective diodes may be arranged above each other or side-by-side. It is particularly space-saving if the diodes are arranged on circuits which serve to control the TFT transistors and, thus, to control the TFT array of the display device.

Thus, the present invention proposes a novel IR sensor system for vehicle qualities, so as to allow for an "ultra-slim border" display design. This approach differs from current IR approaches in displays and is innovative in that the IR detection system is integrated in the dummy pixel region of the display, whereas the emission IR system is arranged, for example, in the backlighting behind the reflector foil. These two factors guarantee that the "ultra-slim border display" and the IR-based system in the car coexist in a common unit. It is important that the gesture recognition and far-field sensing are not affected. It is another advantage that this structural approach ensures the robustness required for automobile standards. Of course, the invention is primarily optimized for gesture recognition and far-field sensing applications and not for touch detection. However, sensing functions in the near filed are also possible. The invention does not affect the optical performance of the display, which is critical for meeting the high automobile requirements. In fact, the present invention provides an imperceptible implementation of the IR photodiodes (PD) in the display region, whereby a harmonic visual perception of the black color in the design is created. For most automobile interior applications, this feature is a must. An advantage of this proposal is the high compatibility of the design which is to be implemented with the current standard thin-film transistor technology of TFT arrays that is used in automobile displays. Therefore, the solution can be produced in standard display series processes with high throughput, scalability, and yield.

Detection System

The detection system proposed in the present invention consists, for example, of IR photodiodes (PD) integrated in the TFT array plane, arranged on the non-illuminating pixel region (dummy pixel region) and surrounding the active region of the display as a part of the viewing area (WA), which is different from e.g. IR detectors of the prior art which are arranged within the active region of the display. Thus, according to the invention, the dummy region of the TFT panel is used that does not display any information to the vehicle user.

Structures of the prior art are available, in which the panel array is used for the integration of IR touch or fingerprint recognition; however, these are highly complex IR sensor design systems, as they are used in applications in which a multi-finger touch detection or a finger pressure detection with high positional accuracy and/or position determination and with high-speed processing is required. In addition, these systems are optimized for processing local changes defined by the fingers of a hand.

In the invention, the focus of the application is entirely different. It is proposed to integrate photodiodes (PD) in the TFT array, so as to enable at least parts of the sensor system for gesture recognition and far field sensing in the display. Here, by integrating IR PDs in the TFT dummy pixel region (non-illuminating pixel display region), this purpose can be served well. A great advantage of this integration into the display TFT is that no additional space is required for the integration of the PDs, whereby the ultra-flat slim border display with integrated IR detection becomes possible. Since nowadays the designs of TFT displays for automobiles are sophisticated, the manufacture of additional PDs for IR detection is simple and compatible with the TFT production processes. Therefore, the present invention can actually cover the reliability standards for automobiles. Of course, the principle of the invention is well adaptable to other consumer and industry displays.

Due to the high optical performance required for displays in automobiles, such as, for example, high contrast and high brightness, the standard integration of PDs into the RGB pixels of the display surface is not suitable. These approaches have a crucial disadvantage, since the overall transmittance of the display is substantially reduced and the overall luminance of the display (typically 900 $CD/m^2$) is significantly impaired. In contrast, in the present invention, the optical performance of the display is not affected by the photodiodes. In fact, the invention makes the design IR-PD system virtually invisible to the vehicle user, which is not achievable by common automobile designs today.

The IR-PDs may be manufactured as PIN-PDs on the TFT array and may be combined directly with the circuit formed on the, for example, LCD panel. Therefore, the electronic design of the IR photodiode is also compatible with the processing of a-Si or LTPS-TFT arrays. Here, the intensity of the signal and the location of the IR-PD are critical, in order to increase the signal-to-noise ratio. Accordingly, the sensitivity of the detection of the IR signal can be improved by increasing the number of IR emitters or by increasing the number of IR-PDs. Since the peak detection wavelength is known (typically 940 nm) and the geometry and position of the display in the vehicle may possibly be known, the optimal position of the PD can be determined well. This provides great flexibility in design efficiency in a CID application. In general, the design can be extended to any design size using the same principle.

Emission System

The IR emission system is advantageously integrated in a backlight unit, a display panel, an optical bonding, an air gap, or a cover lens (with or without touch panel TP). The IR transmitter may be integrated in the rear part of a conventional backlight unit (BLU). Here, the IR transmitters are, for example, configured geometrically behind the BLU reflector as direct illumination elements.

Suitably, a reflector (for example, in the form of a foil) is used which is both transparent in the IR range and highly reflective in the visible range. Here, the main purpose of the reflector is to conceal the IR emitters behind the reflector, maintain a high IR emission signal and ensure the high optical quality of the display which is required according to automobile standards. Although such reflectors are presently available on the market, their application in a display and in the automotive field has not been proposed yet. In fact, the development of this type of reflectors in the form of foils for automobile requirements is actually uncomplicated and does not interfere with the application principle of the present invention. In fact, this backlight design can be used not only for automobiles, but also for other consumer and industry products (cf. also WO-A-2019/197525 whose contents become subject matter of the present patent application by reference).

It is important that in the presently proposed IR configuration in combination with the complete display stack (including the touch panel and the cover glass), the overall IR transmittance is outside the wavelength range of the light for the display and is, for example, 940 nm (+/−5%-10%). In fact. This IR signal emitted by the display enables the IR illumination toward the hand user, which is required for gesture recognition and far-field sensing. However, the invention is not restricted to this wavelength, since the same can be adapted to and optimized for any user case. The overall IR power density and light distribution required for the application can eventually be defined on a case-by-case basis by the number and the positions of the IR radiators.

The invention can thus be used to create a customer-specific IR far-field beyond the display surface, without requiring additional lateral space, thereby facilitating the integration in ultra-flat display designs with a small edge. Here, the IR far-field generated can be used well to interact with a human hand/a finger in a CID application. This can be extended easily and be applied to products for industry and consumer displace.

In fact, the design proposed herein, allows all optical performance characteristics, such as uniformity, luminance and color of the BLU to remain practically intact, since only the reflector is replaced in the backlight unit. Thus, the mechanical dimensions of the BLU are not affected either.

As already mentioned above, the respective semiconductor device is suitably designed as an IR semiconductor diode.

In another advantageous embodiment of the invention, it may be provided that the semiconductor diode of the at least one receiver of the proximity sensor system is configured as a PIN photodiode and comprises n intrinsic semiconductor layer between two oppositely doped semiconductor layers.

Typically, the TFT display panel is provided with circuits formed in TFT technology within the protrusion of the display panel on the upper and/or lower side thereof.

In a further advantageous embodiment of the invention, it may be provided that the semiconductor layer of the at least one receiver and/or the semiconductor layer of the at least one transmitter pf the proximity sensor signal is formed on a insulation layer formed in TFT technology which is formed on a circuit, or a part of a circuit, formed in TFT technology and arranged in the protrusion of the TFT display panel.

The radiation emitted by the at least one transmitter and received by the at least one receiver or the proximity sensor system advantageously is, as already mentioned above, IR radiation as an example of invisible radiation.

The display unit may suitably be formed as a LCD matrix display unit, wherein a liquid crystal medium is located in a gap between the upper side of the display panel and a cover glass, said gap being sealed all around.

In an advantageous embodiment of the invention, the at least one transmitter and/or the at least one receiver can be provided with optics for directing the radiation toward the observation space in front of the display surface.

The display device of the present invention can suitably be provided with a non-optically operating touch sensor system, such as e.g. a touch sensor system operating capacitively, resistively, inductively or based on ultrasound.

In a further suitable development of the invention, the touch sensor system comprises a touch panel positioned on the front side of the display unit or on the color filter layer or behind a cover glass arranged in front of the display unit or in front of the color filter layer.

When both the at least one transmitter and the at least one receiver of the proximity sensor system are arranged in the edge region of the display unit, the at least one transmitter and the at least one receiver are suitably both isolated from each other to prevent crosstalk.

In a further alternatively possible embodiment of the invention, the proximity sensor system comprises as the receiver a receiver matrix with or without optics, which is arranged in the edge region of the display unit and is provided for image acquisition or for 3D acquisition of the observation space.

As an alternative thereto, the proximity sensor system can comprise an image sensor with or without optics, which is arranged in the edge region of the display unit and is provided for image acquisition or for 3D acquisition of the observation space.

Finally, it is also possible that the proximity sensor system comprises a transmitter that can be activated when the ambient light is insufficient for a 2D or 3D acquisition of the observation space.

Figure 2:
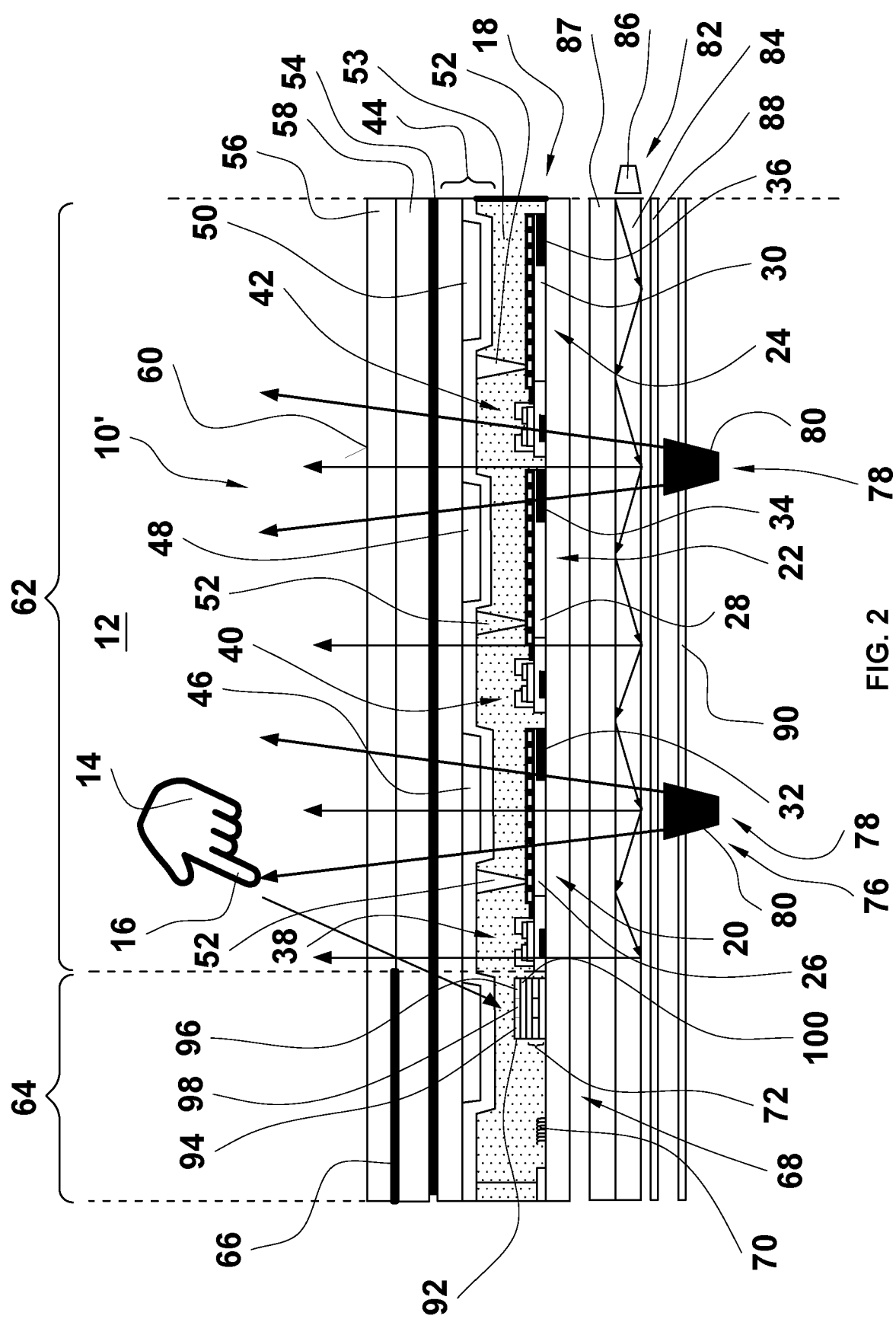
Figure 3:
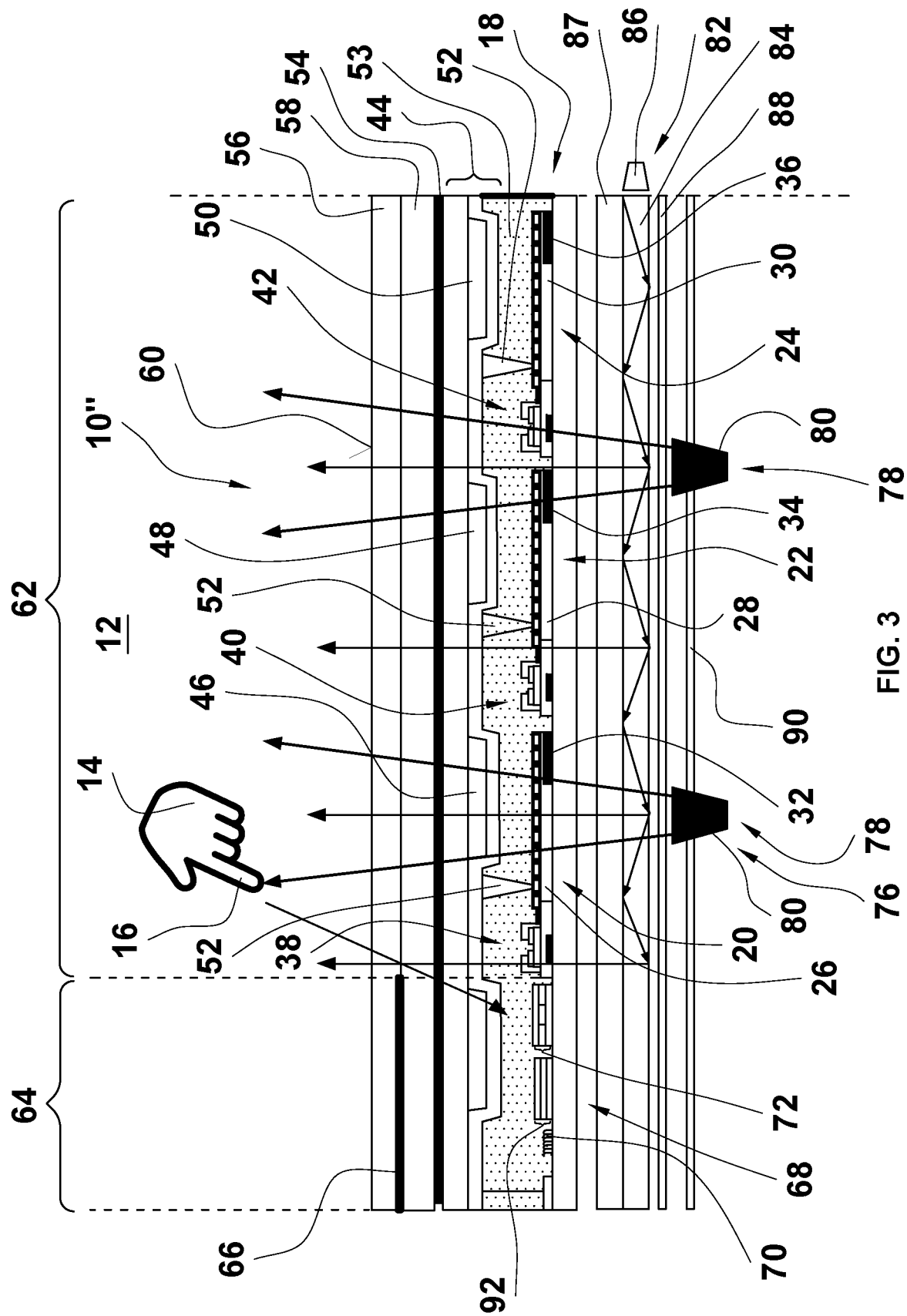
Figure 4:
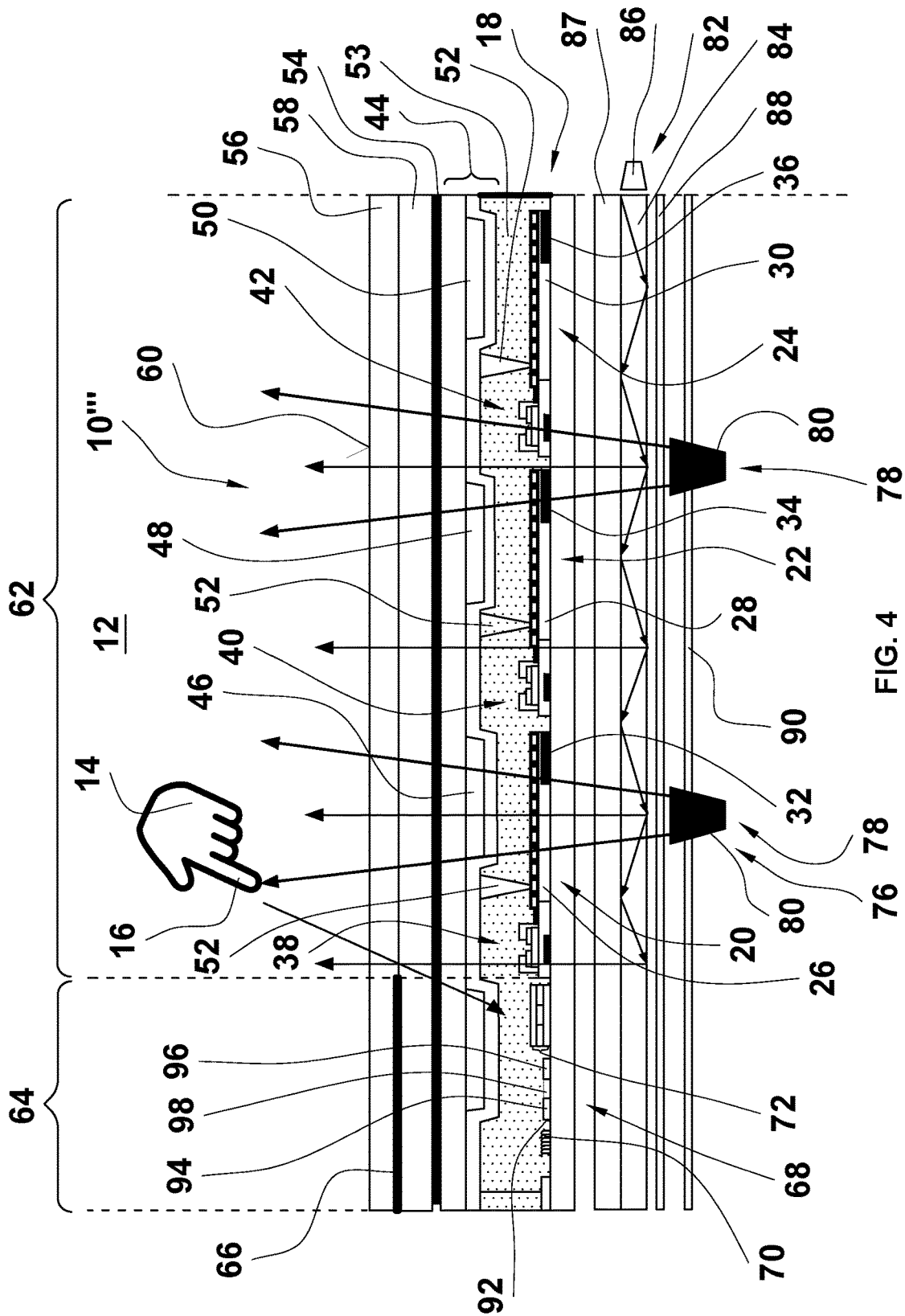

The invention will be described in detail hereinafter with reference to a plurality of embodiments and to the drawings. Specifically, the Figures show:

FIG. 1 a schematic illustration of the features of an LCD display device as an example of a display device according to a first embodiment, which features are essential to the detection of non-visible light by arranging a corresponding sensor system in the edge region of a display, FIG. 2 a schematic illustration of the features of an LCD display device as an example of a display device according to a second embodiment, which features are essential to the detection of non-visible light by arranging a corresponding sensor system in the edge region of a display, FIG. 3 a schematic illustration of the features of an LCD display device as an example of a display device according to a third embodiment, which features are essential to the detection of non-visible light by arranging a corresponding sensor system in the edge region of a display, and FIG. 4 a schematic illustration of the features of an LCD display device as an example of a display device according to a fourth embodiment, which features are essential to the detection of non-visible light by arranging a corresponding sensor system in the edge region of a display.

FIG. 1 schematically shows the components of a display device 10 essential to the invention, with parts of a proximity sensor system arranged in the edge region for the detection of an object present within an observation space 12 in front of the display device 10, e.g. a hand 14 or a finger 16 of a person's hand 14, as is useful in particular for gesture recognition and/or far-field sensing.

The display device 10 comprises a display unit 11 having a LCD panel 18, on which R-, G- and B-pixels 20, 22, 24 are arranged which comprise e.g. an ITO electrode 26, 28, 30 and a pixel capacitance 32, 34, 36. The LCD panel 18 is designed as a TFT glass and comprises TFT transistors 38, 40, 42 manufactured in planar technology and associated to the individual pixels.

Above the LCD panel 18 a color filter layer 44 is located with a R-filter 46 above the R-pixel 20, a G-filter 48 above the G-pixel 22, and a B-filter above the or each B-pixel 24.

The color filter layer 44 is maintained at a uniform distance from the LCD panel 18 by spacers 52. The gap between both is closed by liquid crystal material 53 and is closed toward the circumferential edge, as is generally known for LCD displays.

Above the color filter layer 44 is a touch panel 54 which serves to detect a touch on the display device 10. Such display panels 54 or similar touch sensor systems for display devices are basically known, which is why their structure will not be discussed further herein.

Above the touch panel 54 is a cover glass 56 (also referred to as a cover lens) connected to the touch panel 54 by optical bonding 58.

The front side 60 of the display device 10 comprises the display surface 62 defined by the pixels, around which surface an edge region 64 extends that is not useful for display purposes. This edge region 64 is darkened by a print 66 on the lower side of the cover glass 56, which is transparent to IR light. Within this edge region 64 extends a protrusion region 68 of the LCD panel 18, in which, for example, the routing 70 as well as electronic circuits and/or electronic components 72 for controlling the pixels are arranged.

According to the invention, this protrusion region 68 of the LCD panel 18 is used to arrange at least parts of the proximity sensor system therein. In the embodiment according to FIG. 1, this protrusion region 68 accommodates e.g. receivers 74 of the proximity sensor system 76 which further includes transmitters 78 which, in this embodiment, emit IR radiation. In this embodiment, the transmitters are configured as IR transmitter diodes 80 arranged below the display device 10.

First, a backlight unit 82 is arranged below the display device 10, which unit comprises a light conductor layer 84 in which light fed laterally by backlight light sources 86 is directed toward the display surface 62 of the display device 10. A diffusor layer 87 is located on the light conductor layer 84 for homogenizing the backlight light directed toward the display surface 62. Suitably, the backlight light sources 86 are also LEDs. The backlight unit 82 also comprises a reflector 88 that reflects backlight light escaping downward from the light conductor layer 84. This reflector 88 is a reflector that is transparent to IR radiation, which is why the transmitters 78 can be arranged below the backlight unit 82, while being supported by a supporting structure 90.

As indicated in FIG. 1 by the finger 16 and the hand 14 of a user, which are present in the observation space, IR radiation of the transmitters 78 is reflected toward the receiver(s) 74, whereby it is possible to locate and detect the hand.

Like the transmitters 28, the receivers 74 of the proximity sensor system 76 are suitably also configured as diodes, namely, in this embodiment, as PIN photodiodes 92 for receiving IR radiation. Such a PIN photodiode comprises, for example, a p-doped semiconductor material layer 94, an n-doped semiconductor layer 96 and an intrinsic, i.e. intrinsically conductive semiconductor material layer 98 between the two semiconductor material layers described before. For space saving reasons, the PIN photodiodes 92 are arranged on an electronic component 72 with interposition of an insulation layer 100.

All electronic and optoelectronic components of the LCD panel 16 are applied in planar technology, i.e. layer-wise. This also applies in particular to the PIN photodiodes 92 provided according to the invention, which are configured as vertical PIN diodes in the embodiment of FIG. 1.

In the embodiment according to FIG. 2, the display device 10' is provided with horizontal PIN photodiodes 92 in which the three semiconductor material layers are not arranged above each other but side-by-side, again on an insulation layer 100 which itself is arranged on the electronic component 72. For the rest, it applies to the reference numerals in FIG. 2 that all those elements which are identical in construction or function to the elements in FIG. 1 are identified by the same reference numerals as in FIG. 1.

FIGS. 3 and 4 illustrate two further variants of a display device 19" and 10''', as proposed according to the invention. It applies to FIGS. 3 and 4 as well that those elements which are identical in construction or function are identified by the same reference numerals as in FIG. 1.

It can be seen in FIG. 3 that the PIN photodiodes 92 are configured as vertical PIN photodiodes and are arranged adjacent to the electronic component 72 in the protrusion region 68 of the LCD panel 18. In FIG. 4, the PIN photodiodes 92 are configured as horizontal PIN photodiodes.

LIST OF REFERENCE NUMERALS 10 display device
10' display device
10" display device
10''' display device
11 display unit
12 observation space
14 hand
16 finger
18 LCD panel
20 R-pixel
22 G-pixel
24 B-pixel
26 ITO electrode
28 ITO electrode
30 ITO electrode
32 pixel capacitance
34 pixel capacitance
36 pixel capacitance
38 TFT transistors
40 TFT transistors
42 TFT transistors
44 color filter layer
46 R-filter
48 G-filter
50 B-filter
52 spacer
53 liquid crystal material
54 touchpanel
56 cover glass
58 optical bonding
60 front side
62 display surface
64 edge region
66 print
68 protrusion region
70 routing
72 electronic component
74 receiver
76 proximity sensor system
78 transmitter
80 IR transmitter diodes
82 backlight unit
84 light conductor layer
86 backlighting light source
87 diffusor layer
88 reflector
90 supporting structure
92 PIN photodiodes
94 p-doped semiconductor material layer
96 n-doped semiconductor material layer
98 intrinsically conductive semiconductor material layer
100 insulation layer

ABBREVIATIONS

IR: Infrared
AA: Active area
WA: Viewing area
TP: Touch panel
PD: Photodiode
LCD: Liquid crystal display
TFT: Thin film transistor
LTPS: Low temperature polysilicon
a-Si: amorphous silicon
PIN PD: PIN type semiconductor photodiode
FPC: Flex printed circuit
COG: Chip on glass
OCR: Optically clear resin
OCA: Optically clear adhesive
BL: Backlight
BLU: Backlight unit
CG: Cover glass
GG: Glass-Glass
AR: Anti-reflection
AG: Anti-glare
AFP: Anti-finger print
CID: Center information display
CF: Color filter glass

LIST OF REFERENCES

US 2009/0231497 A1
US 2010/0220269 A1
US 2011/0221705 A1
US 2011/0115749 A1
US 2011/0193818 A1
WO 2014/156399 A1
US 2014/0192023 A1
US 2015/0084928 A1
US 2015/0084928 A1
US 2018/0069609 A1
WO 2019/012046 A1
PCT/EP2019/059234
DE 10 2016 100 363 A1
GB 2 486 000 A
KRATZ, Sven; ROHS, Michael: Hoverflow: Exploring Around-Device Interaction with IR Distance Sensors, 11th International Conference on Human-Computer Interaction with Mobile Devices and Services, MobileHCI '09, Bonn, Germany, Sep. 15-18, 2009, Conference Proceedings, ISBN 978-1-60558-281-8. New York: ACM, 2009. Article No. 42,
KRATZ, Sven: Sensor-Based User Interface Concepts for Continuous, Around-Device and Gestural Interaction on Mobile Devices. Dissertation, Fakultät für Mathematik, Informatik and Statistik, Ludwig-Maximilians-Universität München. München: LMU, 2012,
OH, KyongSae; HWANG, Seok-Hee; YOU, SeungBin et al.: Gesture Sensor for Mobile Devices—White Paper, Firmenanschrift, Samsung Electronics Co. Ltd. Suwon-si, Gyeonggi-do, KR: Samsung, 2013,
BÜRGI, L. [u. a.]: Optical proximity and touch sensors based on monolithically integrated polymer photodiodes and polymer LEDs. In: Organic Electronics, Vol. 7, Nr. 2, 2006, S. 114-120. DOI: https://doi.org/10.1016/j.orgel.2005.12.002. Science Direct [online],
ZHOU, X. [u. a.]: Highly Sensitive a-Si:H PIN Photodiode Gated LTPS TFT for Optical In-Display Fingerprint Identification. In: Society for Information Display International Symposium Digest of Technical Papers, Vol. 49, Nr. 1, 2018, S. 490-493. DOI: https://doi.org/10.1002/sdtp.12608. Wiley Online Library [online].

The invention claimed is:

1. A display device comprising an integrated, optically operating proximity sensor system for detecting an object, including a hand or a finger of a person's hand, present within an observation space in front of the display device, for gesture recognition and/or far-field sensing, the display device being provided with
- a display unit having a front side with a display surface displaying information, an edge region adjacent to the display surface and not used for the display of information, and a rear side, and
- a proximity sensor system comprising at least one transmitter for emitting sensor radiation into the observation space, and comprising at least one receiver for receiving sensor radiation effected from the observation space, wherein
- the at least one transmitter of the proximity sensor system is arranged below the display unit, or below the region occupied by the display surface, or, on the rear side of the display unit or facing the rear side of the display unit or in the display unit, and the at least one receiver of the proximity sensor system is arranged in the edge region adjacent to the display surface on the front or the rear side of the display unit, the display unit comprising a thin film transistor (TFT) display panel having an upper side forming the front side of the display unit which comprises an area aligned with the display surface and having TFT transistors forming the display surface, and a protrusion region surrounding this area and forming the edge region, and having a lower side facing away from the upper side, and comprising a color filter layer arranged above or on the upper side of the display panel, wherein
- the at least one receiver of the proximity sensor system is arranged within the protrusion region of the display panel on the upper or the lower side thereof, and the at least one receiver and/or the at least one transmitter of the proximity sensor system each being configured as a semiconductor diode comprising semiconductor layers formed in TFT technology on the display panel and arranged side-by-side or above each other with abutting each other.

2. The display device according to claim 1, wherein the respective semiconductor diode is formed as an infrared (IR) semiconductor diode for receiving or transmitting IR radiation.

3. The display device according to claim 2, wherein the semiconductor diode of the at least one receiver and/or the semiconductor diode of the at least one transmitter of the proximity sensor system is formed on an insulation layer made in thin-film technology which is arranged on an electronic component, or a part thereof, made in thin-film technology and arranged in the protrusion region of the TFT display panel.

4. The display device according to claim 1, wherein the semiconductor diode of the at least one receiver of the proximity sensor system is designed as a PIN photodiode and comprises an intrinsic semiconductor layer between two oppositely doped semiconductor layers.

5. The display device according to claim 1, wherein within the protrusion of the display panel, the TFT display panel comprises electronic components formed in thin-film technology on the upper and/or lower side thereof.

6. The display device according to claim 1, wherein the radiation emitted by the at least one transmitter and received by the at least one receiver or proximity sensor system is infrared (IR) radiation.

7. The display device according to claim 1, wherein the display unit is designed as a liquid crystal display (LCD) matrix display unit and comprises a liquid crystal medium in a gap between the upper side of the display panel and a cover glass, said gap being sealed all around.

8. The display device according to claim 1, wherein the at least one transmitter and/or the at least one receiver of the proximity sensor system is provided with optics for directing the radiation toward the observation space in front of the display surface.

9. The display device according to claim 1, characterized by a non-optically operating touch sensor system including a touch sensor system operating capacitively, resistively, inductively or on an ultrasound basis.

10. The display device according to claim 9, wherein the touch sensor system comprises a touch panel which is positioned on the front side of the display unit or on the color filter layer or behind a cover glass arranged in front of the display unit or in front of the color filter layer.

11. The display device according to claim 1, wherein when both the at least one transmitter and the at least one receiver of the proximity sensor system are arranged in the edge region of the display unit, the at least one transmitter and the at least one receiver are isolated from each other to prevent crosstalk.

12. The display device according to claim 1, wherein the proximity sensor system comprises as the receiver a receiver matrix with or without optics which is arranged in the edge region of the display unit and is provided for image acquisition or 3-dimensional (3D) acquisition of the observation space.

13. The display device according to claim 12, wherein the proximity sensor system comprises as the receiver an image sensor with or without optics, which is arranged in the edge region of the display unit and is provided for image acquisition or 3D acquisition of the observation space.

14. The display device according to claim 1, wherein the proximity sensor system comprises a transmitter that can be activated if the ambient light is insufficient for 2-dimensional (2D) or 3-dimensional (3D) acquisition of the observation space.

15. The display device according to claim 1, wherein the TFT display panel protrudes beyond the color filter layer at least one edge section and this protrusion forms the edge region laterally adjacent to the display surface, or that the TFT panel display panel comprises, among others, pixels and transistors made in thin-film technology, which together represent the display surface of the display unit, and the TFT display panel protrudes beyond the display surface at least one edge section and this protrusion forms the edge region laterally adjacent to the display surface.

\* \* \* \* \*